United States Patent
Bang

(10) Patent No.: US 6,879,541 B2
(45) Date of Patent: Apr. 12, 2005

(54) INTEGRATED CIRCUIT WITH IMPROVED OUTPUT CONTROL SIGNAL AND METHOD FOR GENERATING IMPROVED OUTPUT CONTROL SIGNAL

(75) Inventor: Jeong-Ho Bang, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/736,651

(22) Filed: Dec. 15, 2003

(65) Prior Publication Data

US 2004/0218428 A1 Nov. 4, 2004

(30) Foreign Application Priority Data

Apr. 29, 2003 (KR) .................................. 10-2003-0026939

(51) Int. Cl.[7] .............................................. G11C 8/00
(52) U.S. Cl. .................. 365/233; 365/189.05; 327/276; 327/161; 327/269; 375/354; 375/240.28
(58) Field of Search ........................... 365/233, 189.05; 327/276, 161, 269; 375/354, 240.28

(56) References Cited

U.S. PATENT DOCUMENTS 5,892,730 A * 4/1999 Sato et al. .................. 365/233
5,953,284 A * 9/1999 Baker et al. ................ 365/233

* cited by examiner

Primary Examiner—Son T. Dinh
Assistant Examiner—N. Nguyen
(74) Attorney, Agent, or Firm—Blakely Sokoloff Taylor & Zafman

(57) ABSTRACT

In a semiconductor integrated circuit, the internal clock that is synchronized to the external clock is counted to output data according to desired specification of the integrated circuit and clock counting in high frequency operation is made be possible by using parallel internal clocks having various delay times. Particularly, reduction of margin of the clock count due to error between the delay time in the delaying circuit and the time to be compensated can be prevented by independently counting the internal clock and the inverted internal clock. The semiconductor integrated circuit for generating an output control signal for controlling output of stored data includes an output control signal generating unit for delaying in parallel, by using a read command internal signal, an internal clock corresponding to an external clock received from external and the inverted internal clock, respectively, and counting the internal clock and the inverted internal clock with delay times different from each other, to output an output control signal.

27 Claims, 10 Drawing Sheets

INTEGRATED CIRCUIT WITH IMPROVED OUTPUT CONTROL SIGNAL AND METHOD FOR GENERATING IMPROVED OUTPUT CONTROL SIGNAL

FIELD OF THE INVENTION

The present invention relates to an integrated circuit; and, more particularly, to an integrated circuit including an improved clock counter, which is applicable for an integrated circuit for counting an internal clock to control an output part by using the internal clock that is synchronized to an external clock, after receiving a read command that is synchronized to the external clock to output required data at a desired timing (clock) when stored data is read from the data storing integrated circuit.

BACKGROUND OF THE INVENTION

FIG. 1 provides a block diagram for outputting data from a general integrated circuit capable of storing data.

In the integrated circuit for outputting data, there are included a command translating unit 110 for translating a command that is received from external to provide a read command internal signal to a data storing unit 130, an address input unit 120 for receiving and buffering an address to output it, the data storing unit 130 for storing data to read, an output control signal generating unit 140 for receiving the read command internal signal and counting an internal clock to output an control signal, and an output unit 150 for outputting the data that is inputted from the data storing unit 130 at a desired clock timing under control of the control signal that is outputted from the output control signal generating unit 140.

FIG. 2 is a detailed block diagram of an output control signal generating unit 140 shown in FIG. 1.

The output control signal generating unit 140 includes a clock count unit 210 for receiving the read command internal signal to count the internal clock, and a control signal generating unit 220 for receiving a count signal that is outputted from the clock count unit 210 to output the control signal for controlling an outputting unit 150 in synchronous with the internal clock.

FIG. 3 describes a block diagram of an output control signal generating unit 140 in prior art, when CL [CAS (Column Address Strobe) Latency] is 5, where CL is an interval between a command clock and a first rising edge of a data strobe signal and the data strobe signal is a signal that is enabled for capturing data.

A first level detecting unit 301 counts the internal clock from the moment of inputting of the read command internal signal to output a count-1 signal Count1. A second level detecting unit 302 counts the inverted internal clock from the moment of receiving of the first count signal Count1 to output a count 1.5 signal Count1.5. In this way, a third to an eighth level detecting units 303–308 output a count 2 signal to a count 4.5 signal, respectively. A ninth level detecting unit 309 and a tenth level detecting unit 310 of the control signal generating unit 220 output an output control signal 5 and an output control signal 5.5 by using the output (count 4.5) of the eighth level detecting unit 308 and the output of the ninth level detecting unit 310 based on the internal clock and the inverted internal clock, respectively.

FIG. 4 shows a timing diagram when the output control signal generating unit in FIG. 3 operates at a low frequency.

When the read command is inputted at an external clock 0 and the desired data is outputted at an external clock 5, the output control signal 5 is generated in synchronous with the internal clock corresponding to the external clock 5. At that time, because a delay between the internal clock and the external clock, i.e., the time that is required to generate the read command internal signal from the read command is not longer than one cycle of the clock at a low frequency, after activation of the read command internal signal, the internal clock can be counted from the internal clock corresponding to the external clock 1, and the output control signal 5 is generated in synchronous with the internal clock corresponding to the external clock timing 5.

However, because the delay between the internal clock and the external clock, i.e., the time that is required to generated the read command internal signal from the read command is longer than one cycle of the clock at a high frequency, the internal clock timing that is initially counted could not be the external clock timing 1 after the read command internal signal is activated.

FIG. 5 shows a timing diagram when the output control signal generating unit in FIG. 3 operates at a high frequency. For example, the internal clock that is initially counted corresponds to the external clock 3 after the read command internal signal is activated.

Because the output control signal 5 is generated in synchronous with the internal clock corresponding to the external clock 7, desired data is not to be outputted at the desired external clock 5. That is, within a higher frequency region where the sum of the delay between the internal clock and the external clock and the time required to generate the read command internal signal from the read command is longer than one cycle of the clock, the conventional clock count unit happened to have a problem in counting the clock to output data with the CL.

SUMMARY OF THE INVENTION

It is, therefore, a primary object of the present invention to provide an integrated circuit including a clock counter capable of operating at a high speed by counting an internal clock that pass through a delay circuit.

Further, it is another object of the present invention to provide an integrated circuit capable of preventing margin of a clock count from being reduced due to error between a delay time in a delay circuit and a time to be compensated, by independently counting an internal clock and the inverted internal.

In accordance with one aspect of the present invention, there is provided a semiconductor integrated circuit for generating an output control signal for controlling output of stored data, including an output control signal generating unit for delaying in parallel, by using a read command internal signal, an internal clock corresponding to an external clock received from external and the inverted internal clock, respectively, and counting the internal clock and the inverted internal clock with delay times different from each other, to output an output control signal.

Desirably, the output control signal generating unit of the present invention includes an internal clock delaying unit for outputting a plurality of delayed internal clocks having delay times different from each other by using the received internal clock, an internal clock edge detecting unit for subsequently counting, after counting the first delayed internal clock among the plurality of the delayed internal clocks by using the read command internal signal, the other delayed internal clocks among the plurality of delayed internal clocks than the first delayed internal clock, an inverted internal clock delaying unit for outputting a plurality of delayed inverted internal clocks having delay times different from each other by using the received inverted internal clock, and an inverted internal clock edge detecting unit for subsequently counting, after counting a first delayed inverted internal clock among the plurality of the delayed inverted internal clocks by using a signal outputted from the internal clock edge detecting unit, the other delayed inverted internal clocks among the plurality of the delayed inverted internal clocks than the first delayed inverted internal clock.

Also, the output control signal generating unit of the present invention includes an internal clock delaying unit for outputting a plurality of delayed internal clocks having delay times different from each other by using the received internal clock, an internal clock edge detecting unit for counting the first delayed internal clock among the plurality of the delayed internal clocks by using the read command internal signal and subsequently counting the other delayed internal clocks among the plurality of the delayed internal clocks than the first delayed internal clock, an inverted internal clock delaying unit for outputting a plurality of delayed inverted internal clocks having delay times different from each other by using the received inverted internal clock, and an inverted internal clock edge detecting unit for counting the first delayed inverted internal clock among the plurality of the delayed inverted internal clocks by using the read command internal signal and subsequently counting the other delayed inverted internal clocks among the plurality of the delayed inverted internal clocks than the first delayed inverted internal clock.

Also, the internal clock delaying unit of the present invention includes a plurality of delaying circuits coupled in parallel to each other for outputting the plurality of the delayed internal clocks.

Also, the internal clock edge detecting unit of the present invention includes a plurality of internal clock edge detecting units, at least coupled to the outputs of the plurality of delay circuits, respectively, for subsequently counting the outputs from the plurality of the delay circuits.

In accordance with another aspect of the present invention, an output control signal generating method for generating an output control signal for controlling output of stored data, includes the steps of (a) outputting a plurality of delayed internal clocks having delay times different from each other by using a received internal clock, (b) subsequently counting, after counting the first delayed internal clock among the plurality of the delayed internal clocks by using a read command internal signal, the other delayed internal clocks among the plurality of the delayed internal clocks than the first delayed internal clock, (c) outputting a plurality of delayed inverted internal clocks having delay times different from each other by using the received inverted internal clock, and (d) subsequently counting, after counting the first delayed inverted internal clock among the plurality of the delayed inverted internal clocks by using the signal outputted at the step (b), the other delayed inverted internal clocks among the plurality of the delayed inverted internal clocks than the first delayed inverted internal clock.

In accordance with another aspect of the present invention, an output control signal generating method for generating an output control signal for controlling output of stored data, includes the steps of (a) outputting a plurality of delayed internal clocks having delay times different from each other by using the received internal clock, (b) subsequently counting, after counting the first delayed internal clock among the plurality of the delayed internal clocks by using a read command internal signal, the other delayed internal clocks among the plurality of the delayed internal clocks than the first delayed internal clock, (c) outputting a plurality of delayed inverted internal clocks having delay times different from each other by using the received inverted internal clock, and (d) subsequently counting, after counting the first delayed inverted internal clock among the plurality of the delayed inverted internal clocks by using a read command internal signal, the other delayed inverted internal clocks among the plurality of the delayed inverted internal clocks than the first delayed inverted internal clock.

Also, one of the plurality of the delayed internal clocks at the step (a) of the present invention includes the delay time between the external clock and the internal clock and the delay time from the read command to generation of the read command internal signal.

Also, the step (b) of the present invention includes a plurality of internal clock edge detecting units for receiving and subsequently counting the plurality of the delayed internal clocks, respectively.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 1:
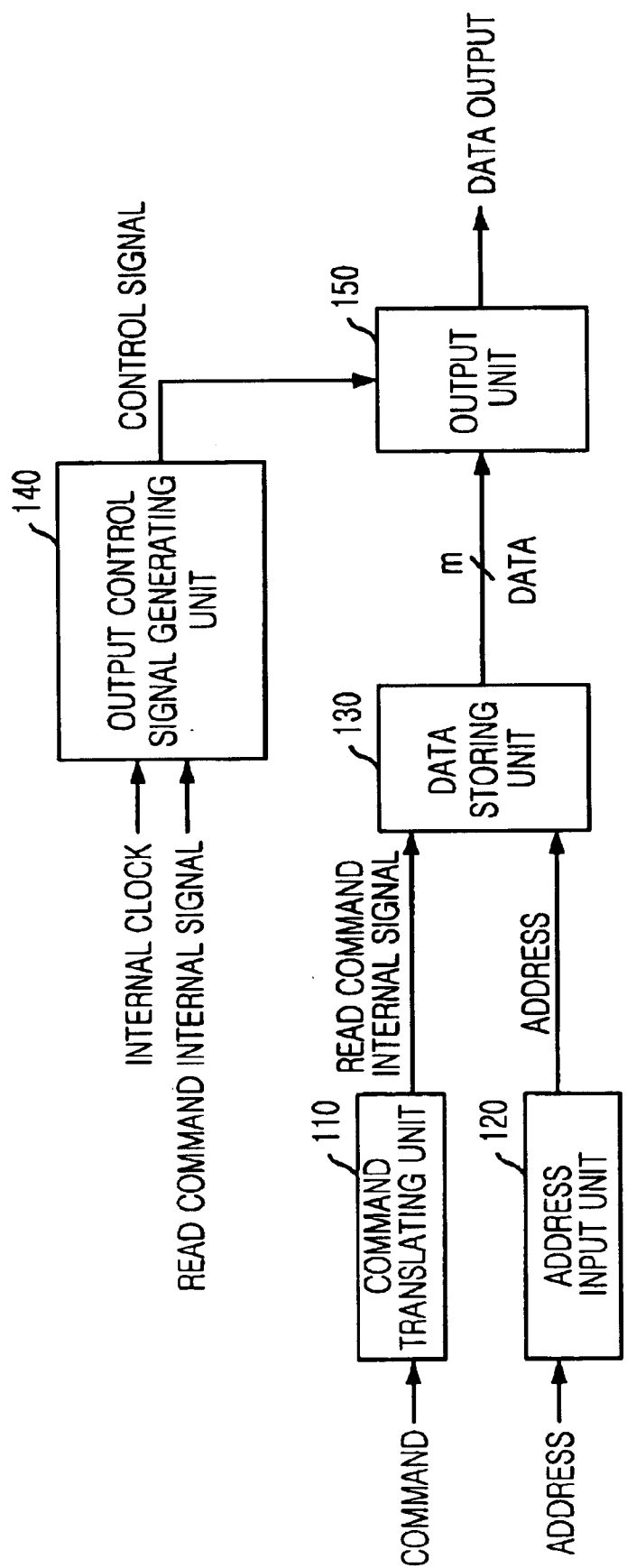
FIG. 1 provides a block diagram for outputting data from a general integrated circuit capable of storing data.
Figure 2:
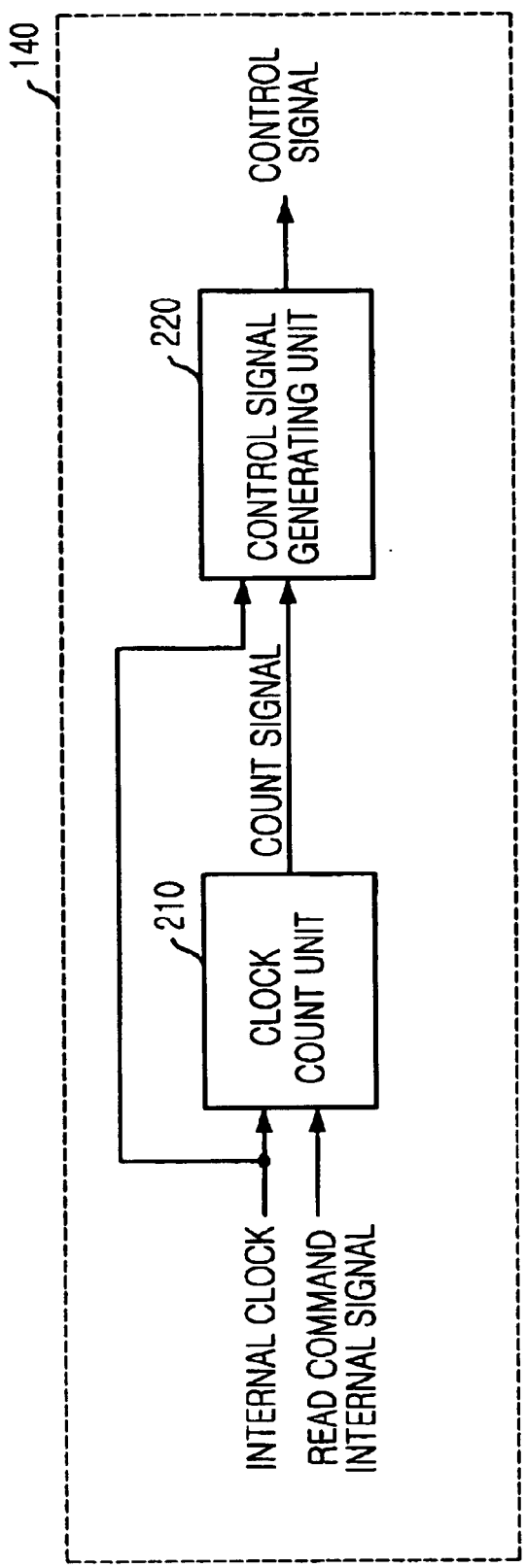
FIG. 2 is a detailed block diagram of an output control signal generating unit shown in FIG. 1.
Figure 3:
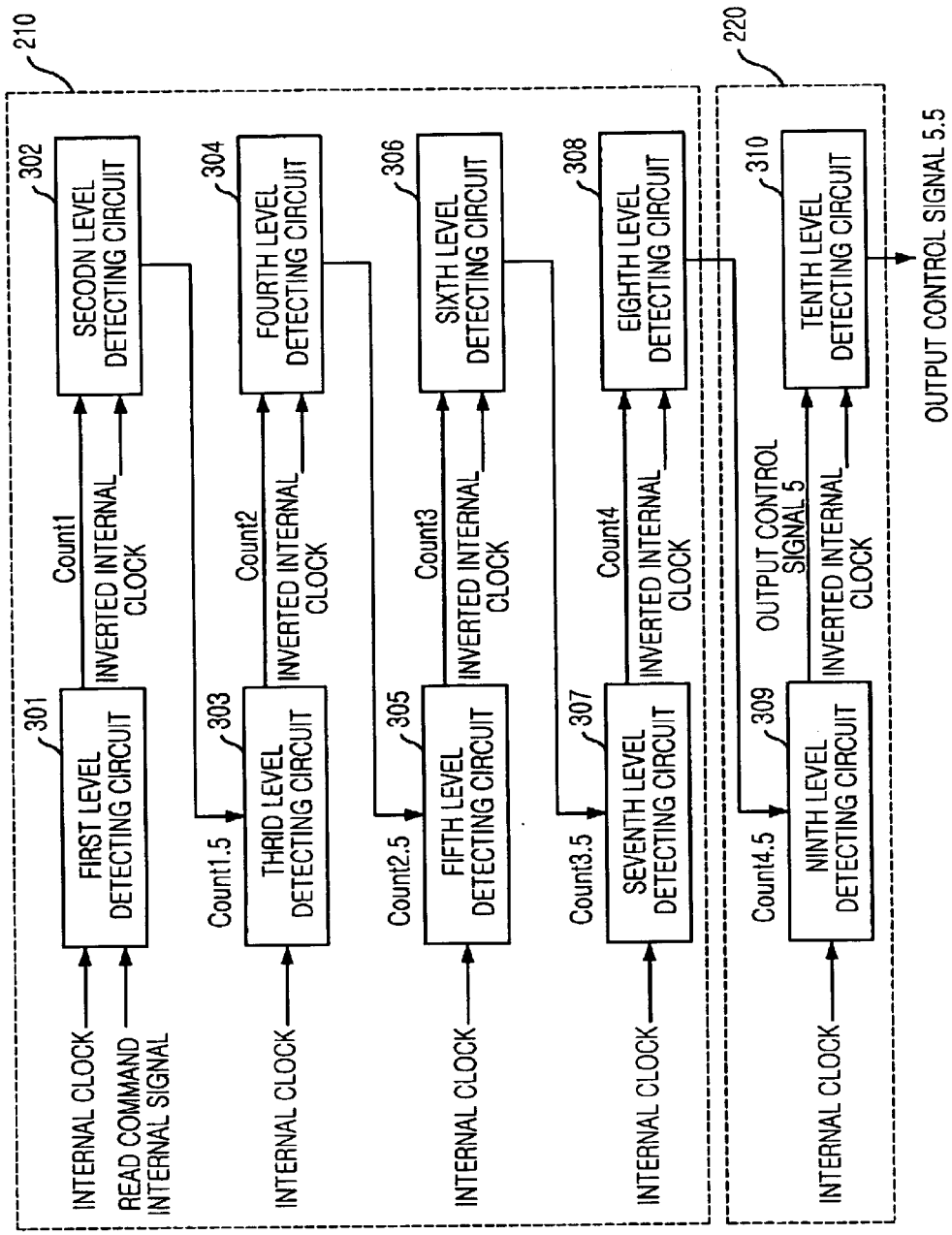
FIG. 3 describes a block diagram of an output control signal generating unit in prior art.
Figure 4:
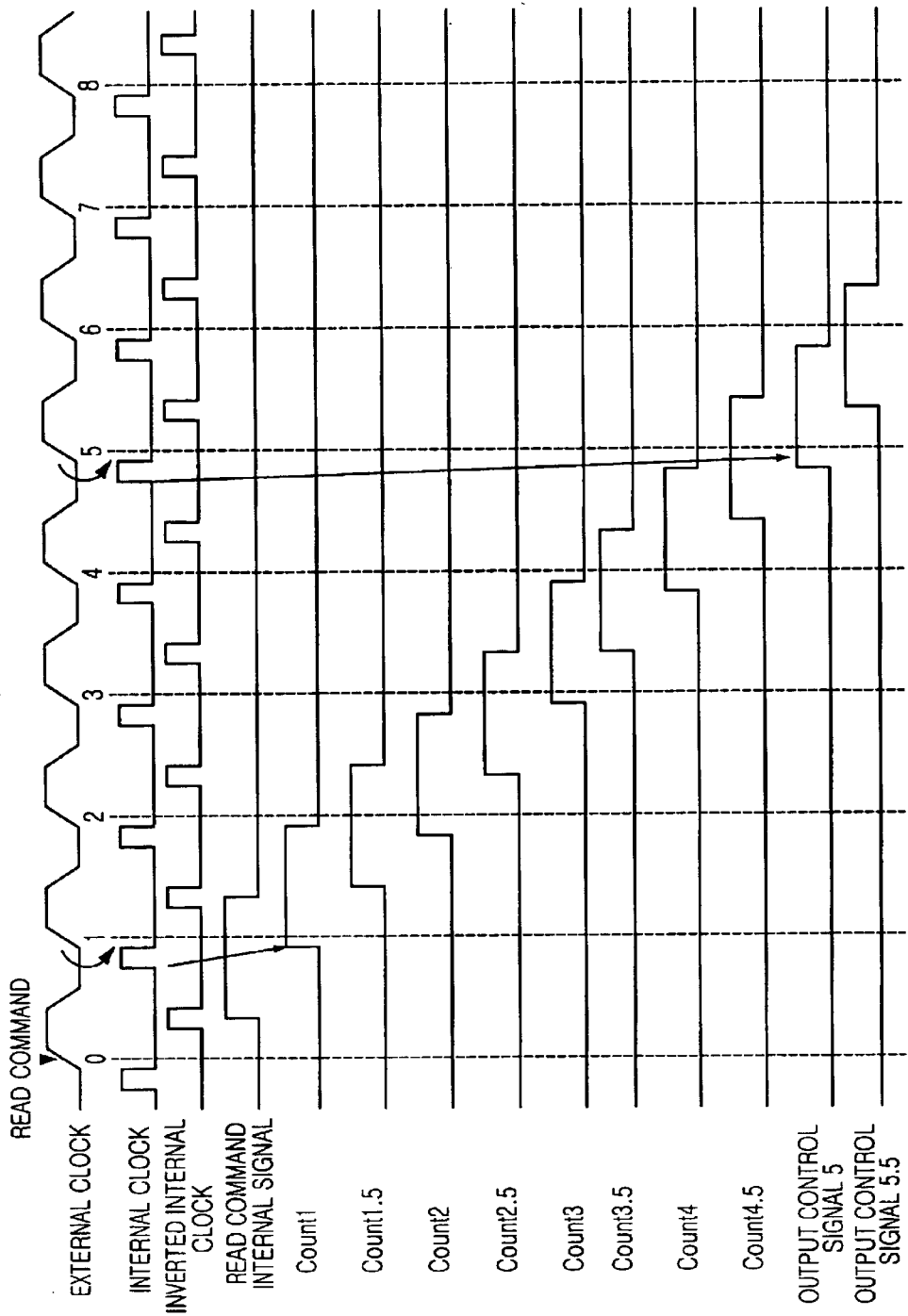
FIG. 4 shows a timing diagram when the output control signal generating unit in FIG. 3 operates at a low frequency.
Figure 5:
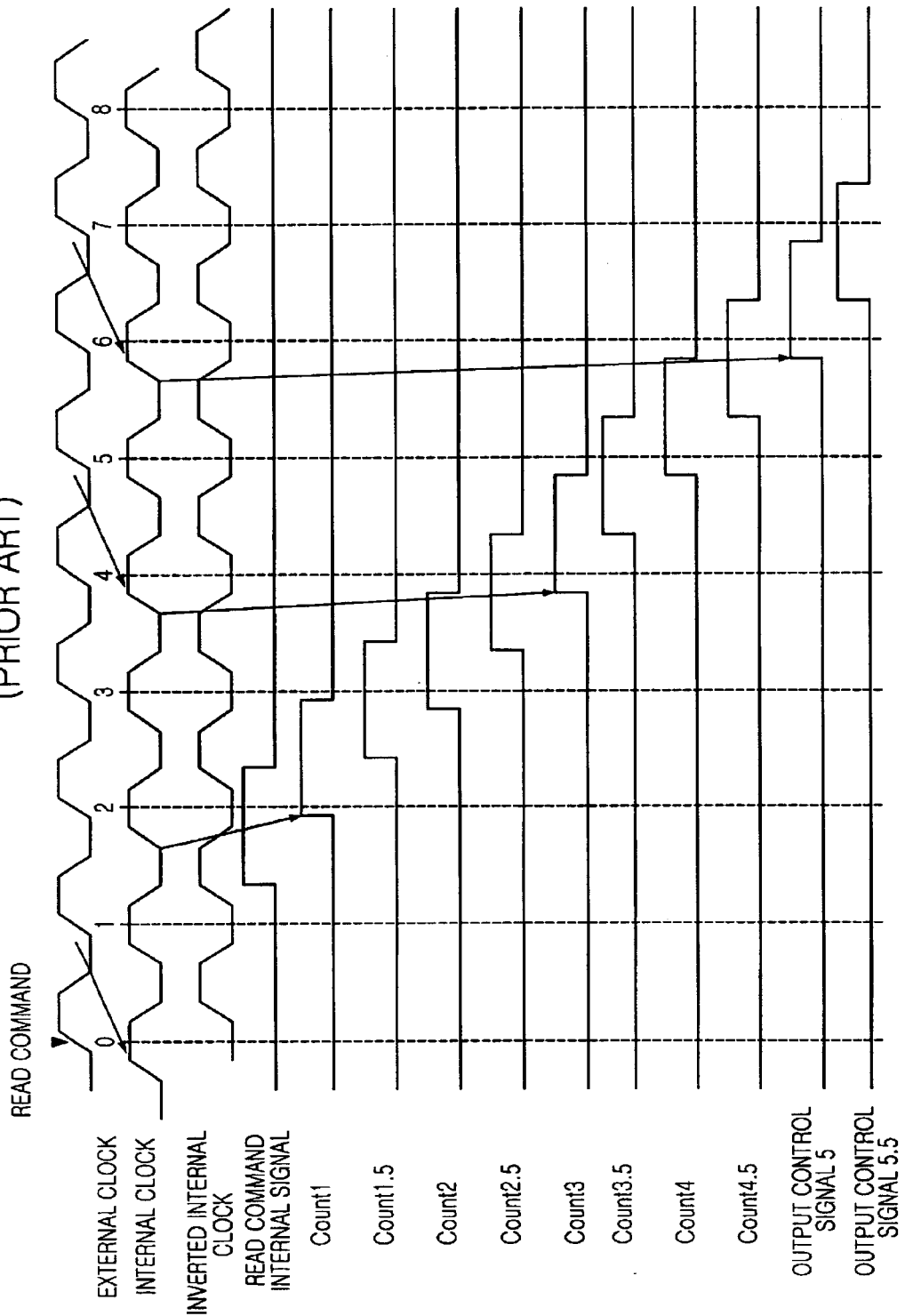
FIG. 5 shows a timing diagram when the output control signal generating unit in FIG. 3 operates at a high frequency.
Figure 6:
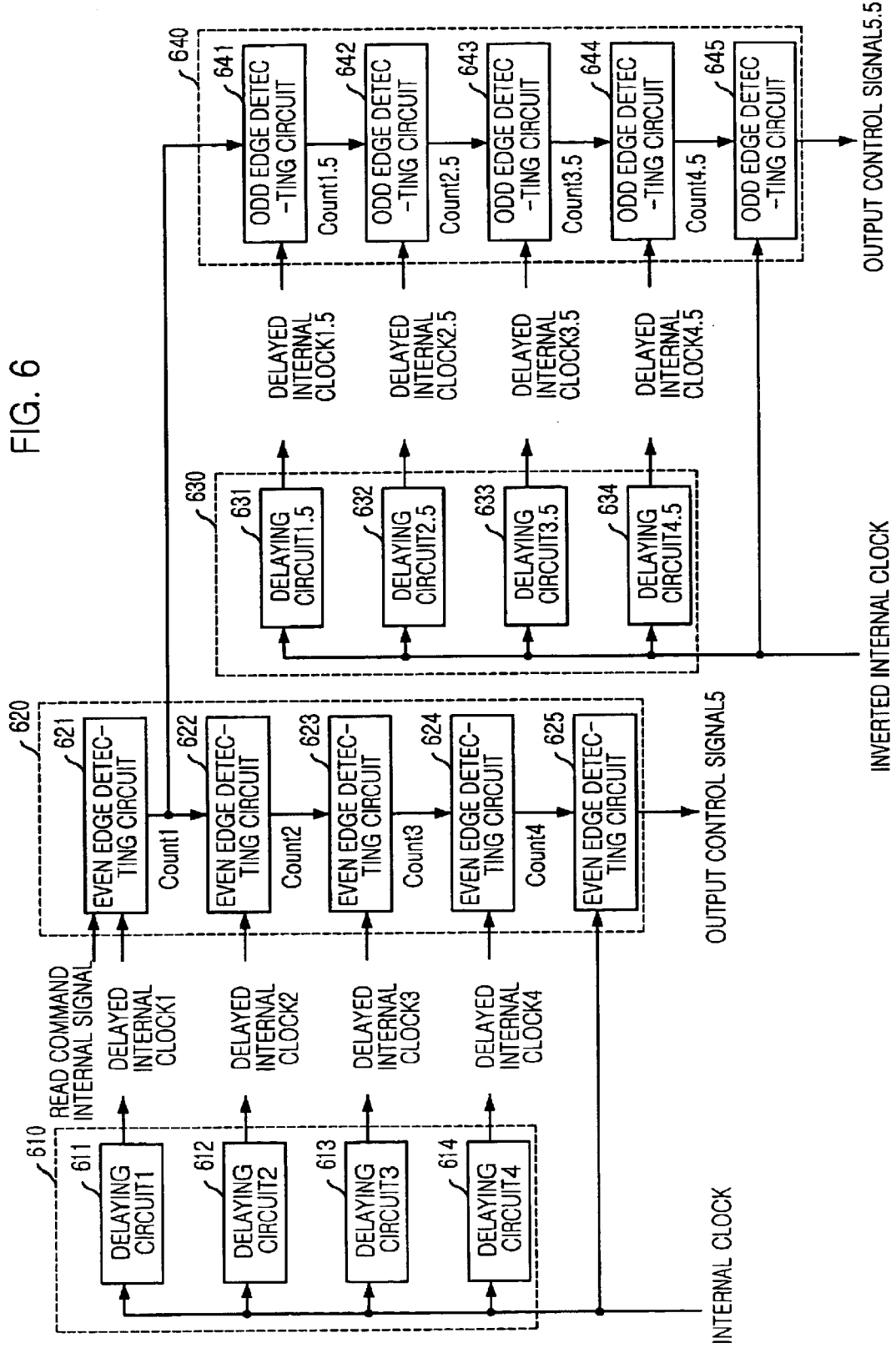
FIG. 6 illustrates a block diagram of an output control signal generating unit in accordance with an embodiment of the present invention.
Figure 7:
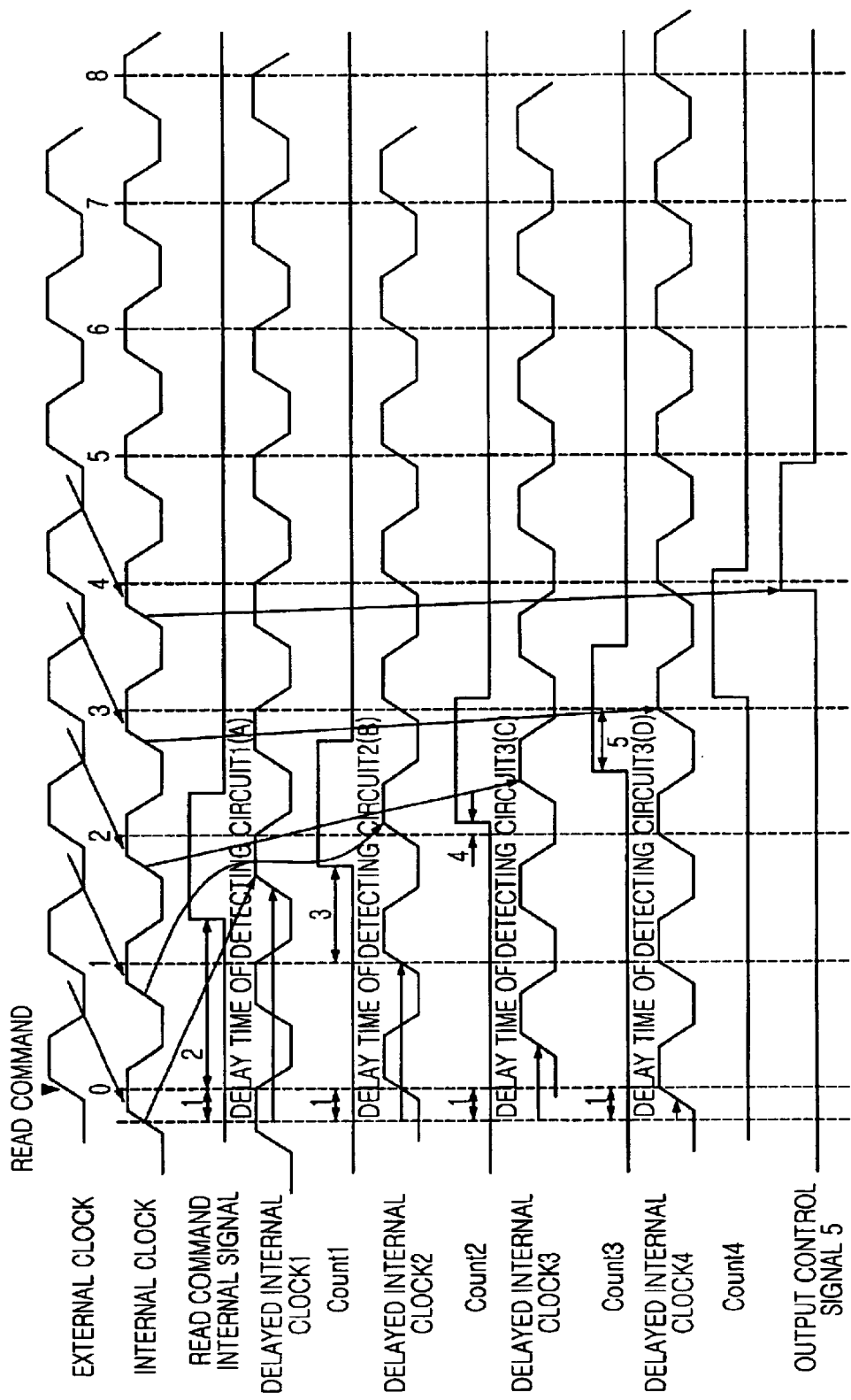
FIG. 7 shows a timing diagram of generating an output control signal 5 from an output control signal generating unit shown in FIG. 6.
Figure 8:
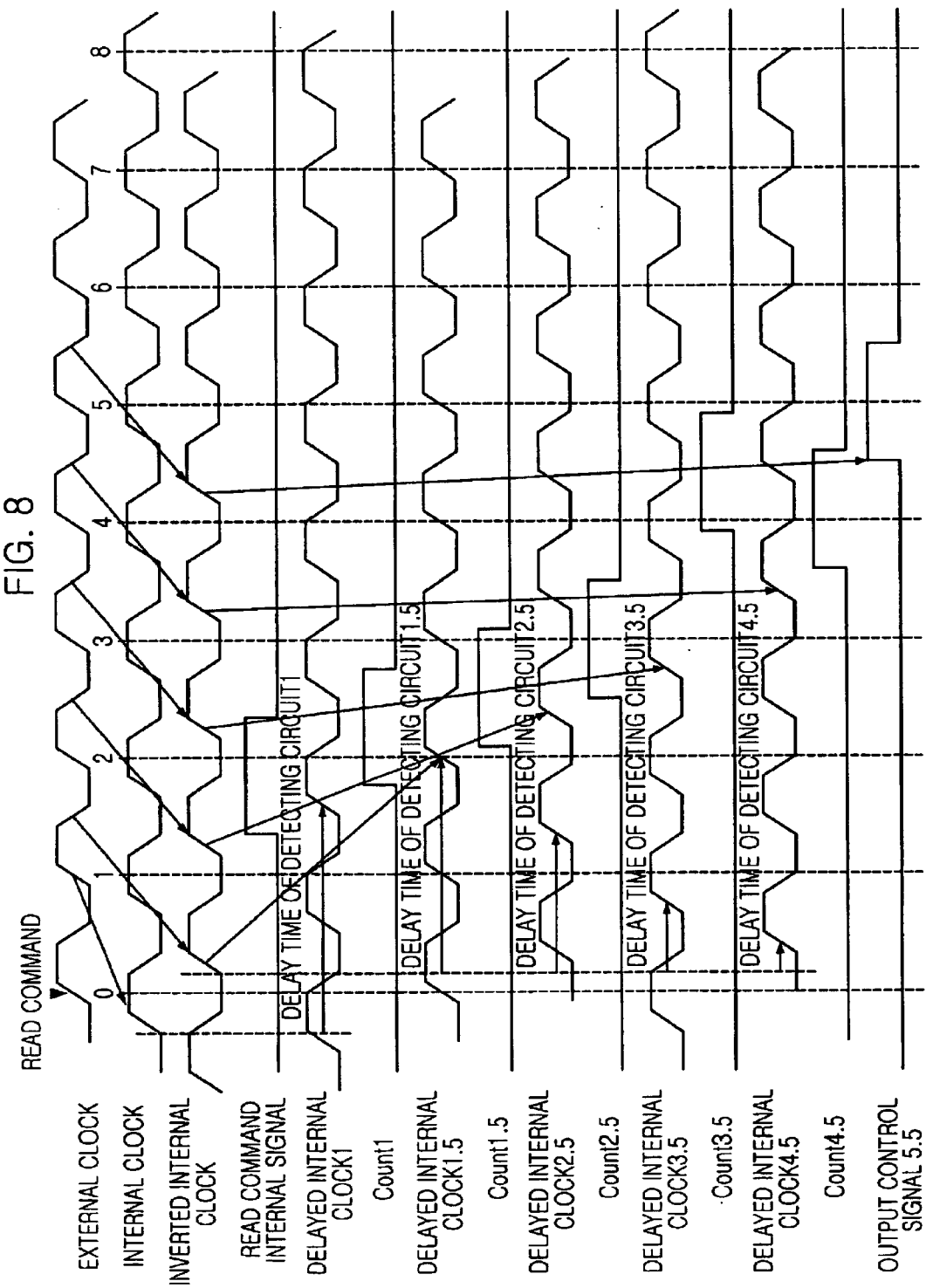
FIG. 8 provides a timing diagram of generating an output control signal 5.5 from an output control signal generating unit shown in FIG. 6.

FIG. 6 illustrates a block diagram of an output control signal generating unit in accordance with an embodiment of the present invention, FIG. 7 shows a timing diagram of generating an output control signal 5 from an output control signal generating unit shown in FIG. 6, and FIG. 8 provides a timing diagram of generating an output control signal 5.5 from an output control signal generating unit shown in FIG. 6.

When CL is 5, the output control signal generating unit 140 of an embodiment of the present invention includes an even clock delaying unit 610 for delaying an inputted internal clock by a predetermined delay time to detect an even edge of the internal clock, an even edge detecting unit 620 for counting the delayed internal clock outputted from the even clock delaying unit 610, an odd clock delaying unit 630 for delaying the inputted inverted internal clock by a predetermined time to detect the odd edge of the internal clock, and an odd clock delaying unit 640 for counting the delayed inverted internal clock outputted from the odd clock delaying unit 630.

Particularly, the even clock delaying unit 610 includes a plurality of delaying circuits. For example, the even clock delaying unit 610 may includes 4 delaying circuits 611, 612, 613, 614. Each of the delaying circuits 611, 612, 613, 614 receives the internal clock in parallel to have respective delay time between an external clock and the internal clock. Also, each of the delaying circuits 611, 612, 613, 614 has the delay time different from each other to detect respective even edge of the internal clock. That is, it is desirable to make the delay time A in the delay circuit 1 611 be equal to or more than a sum of a delay time 1 between the external clock and the internal clock and a delay time 2 from a read command to generation of a read command internal signal to detect the rising edge of the first internal clock 0. The delay circuit 2 612 properly delays to detect the rising edge of the second internal clock 1. The delay circuit 3 613 properly delays to detect the rising edge of the third internal clock 2. The delay circuit 4 614 properly delays to detect the rising edge of the fourth internal clock 3. It will be described in detail about the delay times of the delay circuit 2 to the delay circuit 4 in conjunction with the following description of the operation of the even edge detecting unit 620.

The number of the even edge detecting circuits in the even edge detecting unit 620 is larger than the number of the delay circuits in the even clock delaying unit 610. It will be desirable to have one more even edge detecting circuits than the delaying circuits. According to an embodiment of the present invention, the even edge detecting unit 620 may includes 5 even edge detecting circuits. The even edge detecting unit 1 621 counts the delayed internal clock 1 at the initial rising edge of the delayed internal clock 1 that exists after input of the read command internal signal to output a delayed count 1 signal that is delayed by a predetermined delay time.

The even edge detecting circuit 2 622 counts the delayed internal clock 2 at the initial rising edge of the delayed internal clock 2 that exists after input of the count 1 signal to output a delayed count 2 signal that is delayed by a predetermine delay time. Here, it will be desirable to have the delay time B (FIG. 7) of the delaying circuit 2 612 that outputs the delayed internal clock 2 be equal to or more than a sum of the delay time 1 between the external clock and the internal clock and the difference 3 between the internal clock 1 and the count 1 signal.

The operations of the even edge detecting circuit 3 623 and the even edge detecting circuit 4 624 are similar to the operation of the even edge detecting circuit 2 622. Here, it will be desirable to have the delay time C (FIG. 7) of the delaying circuit 3 613 that outputs the delayed internal clock 3 be equal to or more than a sum of the delay time 1 between the external clock and the internal clock and the difference 4 between the third internal clock 2 and the count 2 signal. Also, it will be desirable to have the delay time D (FIG. 7) of the delaying circuit 4 614 that outputs the delayed internal clock 4 be equal to or more than a sum of the delay time 1 between the external clock and the internal clock and the difference 5 between the fourth internal clock 3 and the count 3 signal. Here, because the even edge detecting circuit 625 should count the internal clock at the initial rising edge of the internal clock that exists after input of the count 4 signal, the delaying circuit 4 614 should delay the delayed internal clock 4 so as to generate the count 4 signal after the rising edge of the fourth internal clock 3. If it is satisfied with this condition, the even edge detecting circuit 625 counts the fifth internal clock 4 that exists after input of the count 4 signal to output a delayed output control signal 5 that is delayed from the fifth internal clock 4 by a predetermined delay time. On the other hand, the enable periods of the count 1 signal to the count 4 signal and the output control signal 5 are equal to the enable period of the read command internal signal.

Also, the constitution and the operation of the odd clock delaying unit 630 and the odd edge detecting unit 640 are similar to those of the even clock delaying unit 610 and the even edge detecting unit 620. For example, the delaying circuit 1.5 631 outputs a delayed internal clock 1.5 that is delayed to have the rising edge of the inverted internal clock 1.5 after the count 1 signal and, in turn, the odd edge detecting circuit 641 outputs the count 1.5 signal that is counted at the rising edge of the delayed internal clock 1.5. Similarly, the delaying circuit 2.5 632 outputs a delayed internal clock 2.5 that is delayed to have the rising edge of the internal clock 2.5 after the count 1.5 signal and, in turn, the odd edge detecting circuit 642 outputs the count 2.5 signal that is counted at the rising edge of the delayed internal clock 2.5. The delaying circuit 3.5 633, the odd edge detecting circuit 643, the delaying circuit 4.5 634 and the odd edge detecting circuit 644 operate similarly. Finally, the odd edge detecting circuit 645 detects the initial rising edge of the inverted internal clock that exists after the count 4.5 signal to output the output control signal 5.5. Here, it should be noticed that the delay time of each of the delaying circuits 631–634 in the odd clock delaying unit 630 have the count 4.5 signal that is inputted to the odd edge detecting circuit 644 locate between the rising edge of the inverted internal clock 4.5 and the rising edge of the inverted internal clock 5.5 so that the odd edge detecting circuit 644 can detect the rising edge of the inverted internal clock 5.5.

Figure 9:
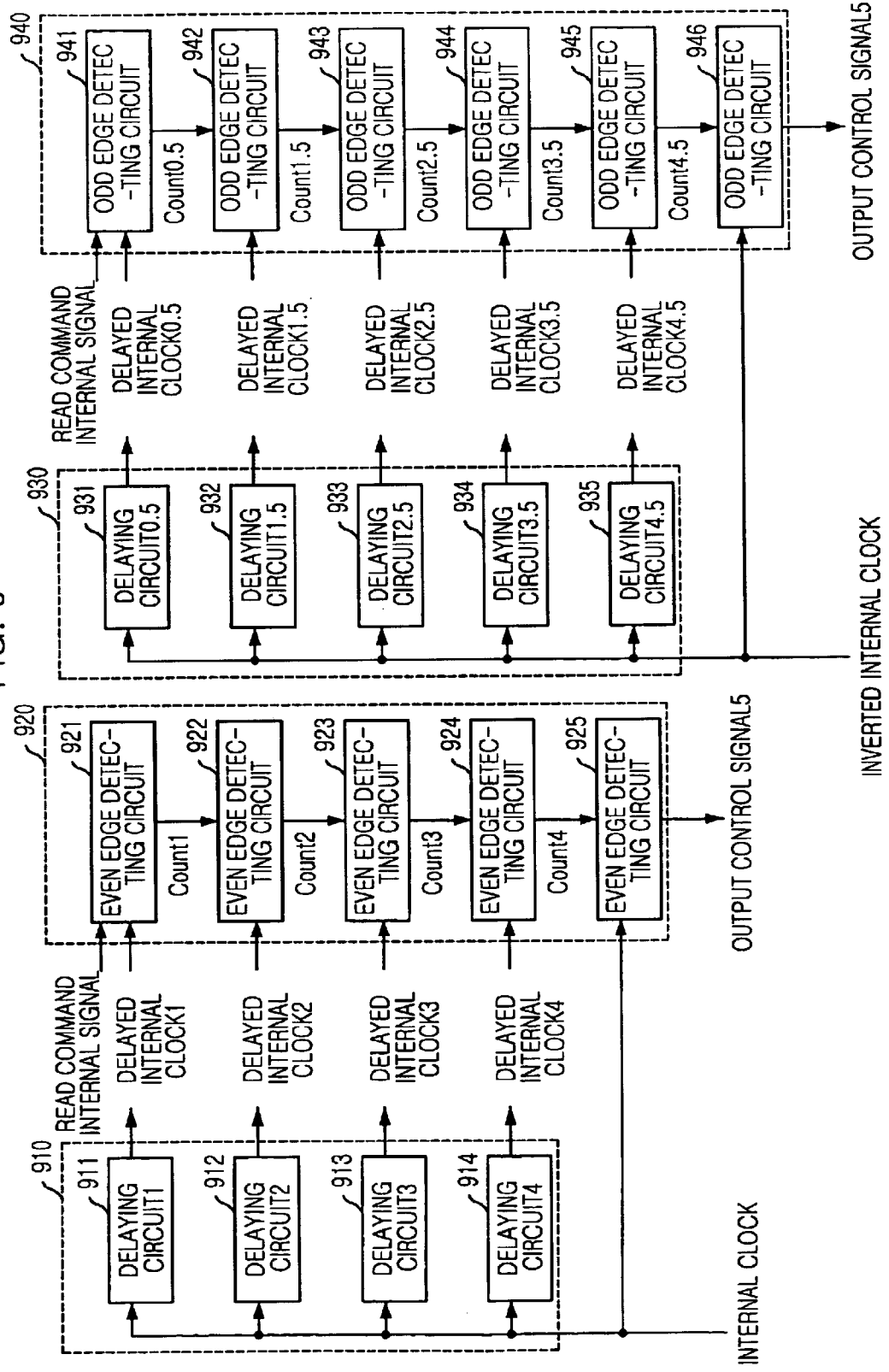
FIG. 9 presents a block diagram of an output control signal generating unit in accordance with another embodiment of the present invention.

FIG. 9 presents a block diagram of an output control signal generating unit in accordance with another embodiment of the present invention.

In its constitution, the embodiment of the present invention shown in FIG. 9 is similar to the embodiment of the present invention shown in FIG. 6 except that the odd clock delaying unit 930 has a delaying circuit 0.5 931 for receiving the inverted internal clock to output the delayed internal clock 0.5 and the odd edge detecting unit 940 has an odd edge detecting circuit 941 for receiving the delayed internal clock 0.5 outputted from the delaying circuit 0.5 931 and the read command internal signal. Further, the odd edge detecting circuit 942 for outputting the count 1.5 signal receives the count 0.5 signal outputted from the odd edge detecting circuit 941 instead of the count 1.

Figure 10:
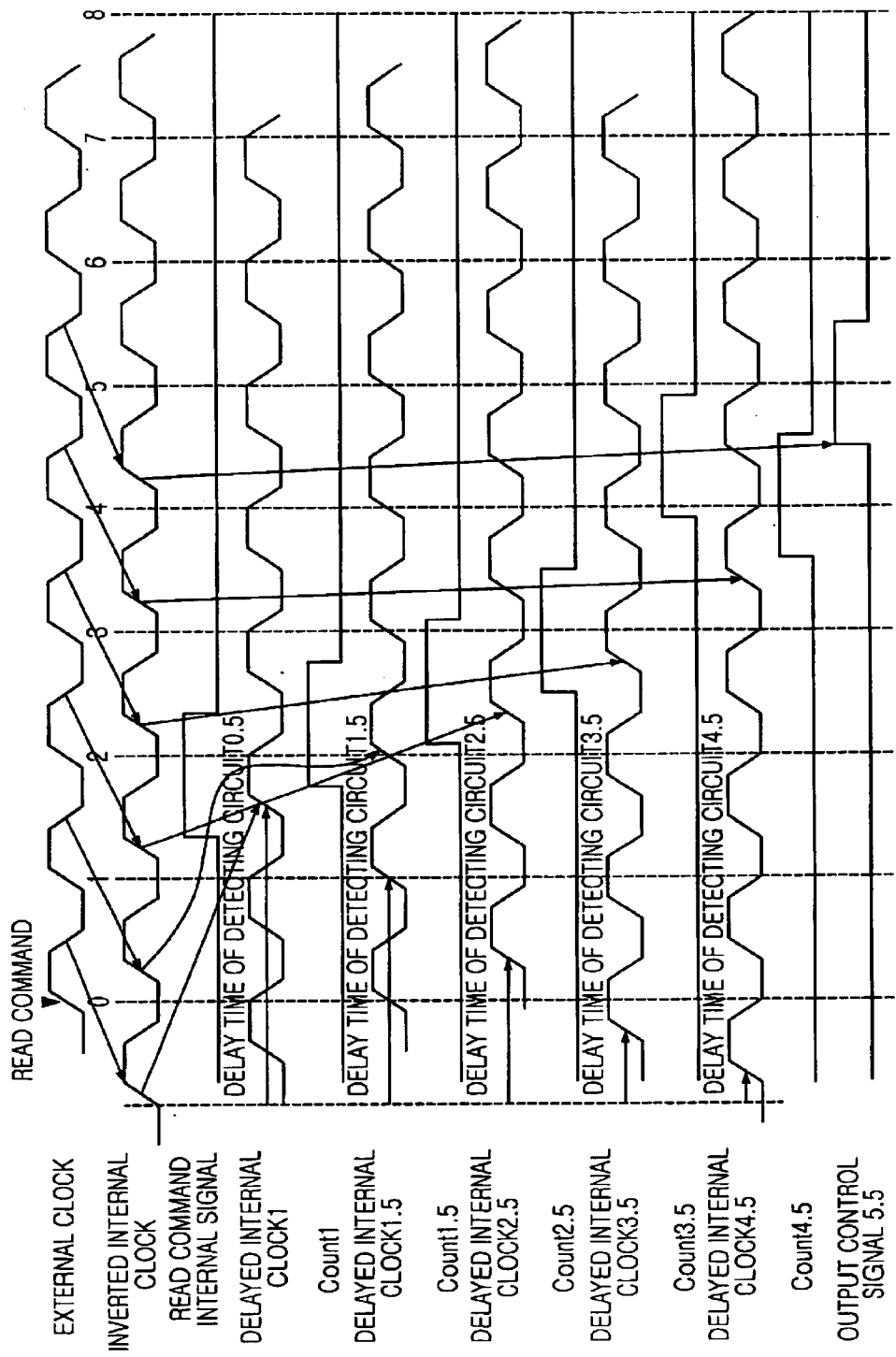
FIG. 10 offers a timing diagram of generating an output control signal 5.5 from an output control signal generating unit shown in FIG. 9.

FIG. 10 offers a timing diagram of generating an output control signal 5.5 from an output control signal generating unit shown in FIG. 9.

After the read command internal signal is activated, the delayed internal clock corresponding to the 0.5-th external clock is counted. The delayed internal clock 0.5 is a delayed version of the inverted internal clock by the delay time of the delaying circuit 0.5. After that, the delayed internal clock 1.5 to the delayed internal clock 4.5 corresponding to the external clock 1.5 to the external clock 4.5 are counted and the output control signal 5.5 is formed by counting the inverted internal clock corresponding to the external clock 5.5.

As described above, in accordance with the present invention, when the internal clock that is synchronized to the external clock is counted to output data according to desired specification of the integrated circuit, clock counting in high frequency operation is made be possible by using parallel internal clocks having various delay times. Particularly, reduction of margin of the clock count due to error between the delay time in the delaying circuit and the time to be compensated can be prevented by independently counting the internal clock and the inverted internal clock so that the present invention can be applied to the integrated circuit that operated at very high speed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor integrated circuit for generating an output control signal for controlling output of stored data, including:

output control signal generating means for delaying in parallel, by using a read command internal signal, an internal clock corresponding to an external clock received from external and the inverted internal clock, respectively, and counting the internal clock and the inverted internal clock with delay times different from each other, to output an output control signal.

2. The semiconductor integrated circuit as recited in claim 1, wherein the output control signal generating unit includes:

internal clock delaying means for outputting a plurality of delayed internal clocks having delay times different from each other by using the received internal clock;

internal clock edge detecting means for subsequently counting, after counting the first delayed internal clock among the plurality of the delayed internal clocks by using the read command internal signal, the other delayed internal clocks among the plurality of delayed internal clocks than the first delayed internal clock;

inverted internal clock delaying means for outputting a plurality of delayed inverted internal clocks having delay times different from each other by using the received inverted internal clock; and inverted internal clock edge detecting means for subsequently counting, after counting the first delayed inverted internal clock among the plurality of the delayed inverted internal clocks by using a signal outputted from the internal clock edge detecting means, the other delayed inverted internal clocks among the plurality of the delayed inverted internal clocks than the first delayed inverted internal clock.

3. The semiconductor integrated circuit as recited in claim 2, wherein the internal clock delaying means includes a plurality of delaying circuits coupled in parallel to each other for outputting the plurality of the delayed internal clocks.

4. The semiconductor integrated circuit as recited in claim 3, wherein the delay times of the plurality of the delaying circuits include the delay time between the external clock and the internal clock.

5. The semiconductor integrated circuit as recited in claim 4, wherein the delay time of the first delaying circuit for outputting the first delayed internal clock further includes the delay time from the read command to generation of the read command internal signal.

6. The semiconductor integrated circuit as recited in claim 5, wherein the internal clock edge detecting means includes a plurality of internal clock edge detecting means, at least coupled to the outputs of the plurality of the delaying circuits, respectively, for subsequently counting the outputs from the plurality of the delaying circuits.

7. The semiconductor integrated circuit as recited in claim 6, wherein one of the plurality of the internal clock edge detecting means receives the output signal from another one of the plurality of the internal clock edge detecting means and counts the internal clock at the initial rising edge of the internal clock that exists after the output signal.

8. The semiconductor integrated circuit as recited in claim 2, wherein the inverted internal clock delaying means includes a plurality of delaying circuits coupled in parallel to each other for outputting the plurality of the delayed inverted internal clocks.

9. The semiconductor integrated circuit as recited in claim 8, wherein the inverted internal clock edge detecting means includes a plurality of inverted internal clock edge detecting means, at least coupled to the outputs of the plurality of the delaying means, respectively, for subsequently counting the outputs of the plurality of the delaying circuits.

10. The semiconductor integrated circuit as recited in claim 9, wherein one of the inverted integral clock edge detecting means receives the output signal from another one of the plurality of the inverted internal clock edge detecting means and counts the inverted internal clock at the initial rising edge of the inverted internal clock that exists after the output signal.

11. The semiconductor integrated circuit as recited in claim 1, wherein the output control signal generating unit includes:

internal clock delaying means for outputting a plurality of delayed internal clocks having delay times different from each other by using the received internal clock;

internal clock edge detecting means for subsequently counting, after counting the first delayed internal clock among the plurality of the delayed internal clocks by using the read command internal signal, the other delayed internal clocks among the plurality of the delayed internal clocks than the first delayed internal clock;

inverted internal clock delaying means for outputting a plurality of delayed inverted internal clocks having delay times different from each other by using the received inverted internal clock; and inverted internal clock edge detecting means for subsequently counting, after counting the first delayed inverted internal clock among the plurality of the delayed inverted internal clocks by using the read command internal signal, the other delayed inverted internal clocks among the plurality of the delayed inverted internal clocks than the first delayed inverted internal clock.

12. The semiconductor integrated circuit as recited in claim 11, wherein the internal clock delaying means includes a plurality of delaying circuits coupled in parallel to each other for outputting the plurality of the delayed internal clocks.

13. The semiconductor integrated circuit as recited in claim 12, wherein the delay times of the plurality of the delaying circuits include the delay time between the external clock and the internal clock.

14. The semiconductor integrated circuit as recited in claim 13, wherein the delay time of the first delaying circuit for outputting the first delayed internal clock further includes the delay time from the read command to generation of the read command internal signal.

15. The semiconductor integrated circuit as recited in claim 12, wherein the internal clock edge detecting means includes a plurality of internal clock edge detecting means, at least coupled to the outputs of the plurality of the delaying circuits, respectively, for subsequently counting the outputs from the plurality of the delaying circuits.

16. The semiconductor integrated circuit as recited in claim 15, wherein one of the plurality of the internal clock edge detecting means receives the output signal from another one of the plurality of the internal clock edge detecting means and counts the internal clock at the initial rising edge of the internal clock that exists after the output signal.

17. The semiconductor integrated circuit as recited in claim 11, wherein the inverted internal clock delaying means includes a plurality of delaying circuits coupled in parallel to each other for outputting the plurality of the delayed inverted internal clocks.

18. The semiconductor integrated circuit as recited in claim 17, wherein the inverted internal clock edge detecting means includes a plurality of inverted internal clock edge detecting means, at least coupled to the outputs of the plurality of the delaying means, respectively, for subsequently counting the outputs of the plurality of the delaying circuits.

19. The semiconductor integrated circuit as recited in claim 18, wherein one of the inverted integral clock edge detecting means receives the output signal from another one of the plurality of the inverted internal clock edge detecting means and counts the inverted internal clock at the initial rising edge of the inverted internal clock that exists after the output signal.

20. An output control signal generating method for generating an output control signal for controlling output of stored data, the method comprising the steps of:
  (a) outputting a plurality of delayed internal clocks having delay times different from each other by using a received internal clock;
  (b) subsequently counting, after counting the first delayed internal clock among the plurality of the delayed internal clocks by using a read command internal signal, the other delayed internal clocks among the plurality of the delayed internal clocks than the first delayed internal clock;
  (c) outputting a plurality of delayed inverted internal clocks having delay times different from each other by using the received inverted internal clock; and
  (d) subsequently counting, after counting the first delayed inverted internal clock among the plurality of the delayed inverted internal clocks by using the signal outputted at the step (b), the other delayed inverted internal clocks among the plurality of the delayed inverted internal clocks than the first delayed inverted internal clock.

21. The output control signal generating method as recited in claim 20, wherein one of the plurality of the delayed internal clocks at the step (a) includes a delay time between the external clock and the internal clock and a delay time from the read command to generation of the read command internal signal.

22. The output control signal generating method as recited in claim 21, wherein the step (b) includes a plurality of internal clock edge detecting means for at least receiving and subsequently counting the plurality of the delayed internal clocks, respectively.

23. The output control signal generating method as recited in claim 22, wherein one of the plurality of the internal clock edge detecting means receives the output signal from another one of the plurality of the internal clock edge detecting means and counts the internal clock at the initial rising edge of the internal clock that exists after the output signal.

24. An output control signal generating method for generating an output control signal for controlling output of stored data, the method includes the steps of
  (a) outputting a plurality of delayed internal clocks having delay times different from each other by using the received internal clock;
  (b) subsequently counting, after counting the first delayed internal clock among the plurality of the delayed internal clocks by using a read command internal signal, the other delayed internal clocks among the plurality of the delayed internal clocks than the first delayed internal clock;
  (c) outputting a plurality of delayed inverted internal clocks having delay times different from each other by using the received inverted internal clock; and
  (d) subsequently counting, after counting the first delayed inverted internal clock among the plurality of the delayed inverted internal clocks by using the read command internal signal, the other delayed inverted internal clocks among the plurality of the delayed inverted internal clocks than the first delayed inverted internal clock.

25. The output control signal generating method as recited in claim 24, wherein one of the plurality of the delayed internal clocks at the step (a) includes a delay time between the external clock and the internal clock and a delay time from the read command to generation of the read command internal signal.

26. The output control signal generating method as recited in claim 25, wherein the step (b) includes a plurality of internal clock edge detecting means for at least receiving and subsequently counting the plurality of the delayed internal clocks, respectively.

27. The output control signal generating method as recited in claim 26, wherein one of the plurality of the internal clock edge detecting means receives the output signal from another one of the plurality of the internal clock edge detecting means and counts the internal clock at the initial rising edge of the internal clock that exists after the output signal.

* * * * *